US009257413B2

(12) United States Patent
Yang et al.

(10) Patent No.: US 9,257,413 B2
(45) Date of Patent: Feb. 9, 2016

(54) STACK PACKAGES INCLUDING DIFFUSION BARRIERS OVER SIDEWALLS OF THROUGH VIA ELECTRODES AND METHODS OF MANUFACTURING THE SAME

(71) Applicant: SK hynix Inc., Icheon-si (KR)

(72) Inventors: Seung Taek Yang, Seoul (KR); Jong Hoon Kim, Suwon-si (KR); Tac Keun Oh, Seoul (KR); Song Na, Jeonju-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/189,876

(22) Filed: Feb. 25, 2014

(65) Prior Publication Data
US 2015/0061120 A1 Mar. 5, 2015

(30) Foreign Application Priority Data

Aug. 29, 2013 (KR) .......................... 10-2013-0103078

(51) Int. Cl.
*H01L 25/065* (2006.01)
*H01L 25/00* (2006.01)
*H01L 23/00* (2006.01)
*H01L 21/56* (2006.01)
*H01L 23/31* (2006.01)

(52) U.S. Cl.
CPC ............ *H01L 25/0657* (2013.01); *H01L 24/13* (2013.01); *H01L 24/19* (2013.01); *H01L 24/96* (2013.01); *H01L 24/97* (2013.01); *H01L 25/50* (2013.01); *H01L 21/561* (2013.01); *H01L 21/568* (2013.01); *H01L 23/3192* (2013.01); *H01L 2224/0401* (2013.01); *H01L 2224/04105* (2013.01); *H01L 2224/0557* (2013.01); *H01L 2224/05567* (2013.01); *H01L 2224/06181* (2013.01); *H01L 2224/12105* (2013.01); *H01L 2224/1403* (2013.01); *H01L 2224/16145* (2013.01); *H01L 2224/32145* (2013.01); *H01L 2224/73204* (2013.01); *H01L 2224/73259* (2013.01); *H01L 2224/81005* (2013.01); *H01L 2224/81193* (2013.01); *H01L 2224/83005* (2013.01); *H01L 2224/92125* (2013.01); *H01L 2224/92224* (2013.01); *H01L 2225/06513* (2013.01); *H01L 2225/06524* (2013.01); *H01L 2225/06541* (2013.01); *H01L 2225/06565* (2013.01); *H01L 2924/10253* (2013.01); *H01L 2924/1431* (2013.01); *H01L 2924/1436* (2013.01); *H01L 2924/1437* (2013.01); *H01L 2924/1441* (2013.01); *H01L 2924/15311* (2013.01); *H01L 2924/15788* (2013.01);
(Continued)

(58) Field of Classification Search
CPC ..... H01L 25/0657; H01L 24/96; H01L 24/97; H01L 25/50
See application file for complete search history.

(56) References Cited

U.S. PATENT DOCUMENTS 4,701,424 A * 10/1987 Mikkor .......................... 438/455
7,843,052 B1 11/2010 Yoo et al.
(Continued)

*Primary Examiner* — William Coleman

(57) ABSTRACT

Embodiments of a stack package may include an upper chip on a lower chip, a backside passivation layer covering the backside surface of the lower chip and having a thickness which is substantially equal to a height of the protrusion portion of a lower through via electrode, a backside bump substantially contacting the protrusion portion, and a front side bump electrically connected to a chip contact portion of the upper chip and physically and electrically connected to the backside bump. The backside passivation layer may include a first insulation layer provided over a sidewall of the protrusion portion and the backside surface of the lower chip. Embodiments of fabrication methods are also disclosed.

17 Claims, 16 Drawing Sheets

(52) U.S. Cl.
CPC . *H01L2924/181* (2013.01); *H01L 2924/18161* (2013.01)

(56) References Cited

U.S. PATENT DOCUMENTS

| | | | |
|---|---|---|---|
| 8,334,174 B2 * | 12/2012 | Chang et al. | 438/118 |
| 8,963,336 B2 * | 2/2015 | Jung et al. | 257/774 |
| 2006/0166402 A1 * | 7/2006 | Lim et al. | 438/108 |
| 2009/0108443 A1 * | 4/2009 | Jiang | 257/737 |
| 2009/0278244 A1 * | 11/2009 | Dunne et al. | 257/676 |
| 2010/0013100 A1 * | 1/2010 | Xiao et al. | 257/751 |
| 2011/0101523 A1 * | 5/2011 | Hwang et al. | 257/737 |
| 2012/0205797 A1 * | 8/2012 | Bae et al. | 257/737 |
| 2014/0091473 A1 * | 4/2014 | Len et al. | 257/774 |

* cited by examiner

STACK PACKAGES INCLUDING DIFFUSION BARRIERS OVER SIDEWALLS OF THROUGH VIA ELECTRODES AND METHODS OF MANUFACTURING THE SAME

CROSS-REFERENCE TO RELATED APPLICATION

The present application claims priority under 35 U.S.C 119(a) to Korean Application No. 10-2013-0103078, filed on Aug. 29, 2013, in the Korean intellectual property Office, which is incorporated by reference in its entirety herein as set forth in full.

BACKGROUND

1. Technical Field

Embodiments relate to package technologies and, more particularly, to stack packages including through via electrodes and methods of manufacturing the same.

2. Related Art

Semiconductor devices employed in electronic systems may include various electronic circuit elements, and the electronic circuit elements may be integrated in and/or on a semiconductor substrate to constitute the semiconductor device (also, referred to as a semiconductor chip or a semiconductor die). Memory semiconductor chips may also be employed in the electronic systems. Before the semiconductor devices including the memory semiconductor chips are employed in the electronic systems, the semiconductor devices may be encapsulated to form a package. These semiconductor packages may be employed in the electronic systems, for example, computers, mobile systems or data storage media.

As the mobile systems such as smart phones become lighter and smaller, the semiconductor packages employed in the mobile systems have been continuously scaled down. In addition, large capacitive semiconductor packages are increasingly in demand with the development of multi-functional mobile systems. In connection with this, efforts have been directed to putting a plurality of semiconductor devices in a single package in order to provide the large capacitive semiconductor packages such as stack packages. Further, through silicon via (TSV) electrodes penetrating the semiconductor chip, have been proposed to electrically connect the semiconductor chips in a single stack package to each other.

SUMMARY

Various embodiments are directed to stack packages and methods of manufacturing the same.

According to some embodiments, a stack package includes an upper chip on a lower chip, a lower through via electrode penetrating the lower chip and including a protrusion portion that protrudes from a backside surface of the lower chip, a backside passivation layer covering the backside surface of the lower chip and having a thickness which is substantially equal to a height of the protrusion portion, a backside bump substantially contacting a top surface of the protrusion portion, and a front side bump electrically connected to a chip contact portion of the upper chip and physically and electrically connected to the backside bump. The backside passivation layer includes a first insulation layer covering a sidewall of the protrusion portion and the backside surface of the lower chip and a second insulation layer on the first insulation layer.

According to further embodiments, a stack package includes an upper chip disposed on a lower chip that a lower through via electrode penetrates, a molding member covering sidewalls of the lower chip and sidewalls of the upper chip, an outer connection terminal disposed on a front side surface of the lower chip and on a bottom surface of the molding member, and a redistribution line electrically connecting the outer connection terminal to the lower through via electrode and disposed on the front side surface of the lower chip.

According to further embodiments, a method of manufacturing a stack package includes forming a first insulation layer on a backside surface of a lower chip including a lower through via electrode. The lower through via electrode has a protrusion portion protruding from the backside surface of the lower chip, and the first insulation layer is formed to cover a sidewall of the protrusion portion. A second insulation layer is formed on the first insulation layer, and the second insulation layer is formed to have a thickness which is substantially equal to a height of the protrusion portion. A backside bump is formed to substantially contact a top surface of the protrusion portion. An upper chip is stacked on the lower chip such that the backside bump is electrically and physically connected to a front side bump electrically connected to a chip contact portion of the upper chip. The first insulation layer and the second insulation layer constitute a backside passivation layer.

BRIEF DESCRIPTION OF THE DRAWINGS

Embodiments are described in view of the attached drawings and accompanying detailed description, in which.

DETAILED DESCRIPTION

Figure 1:
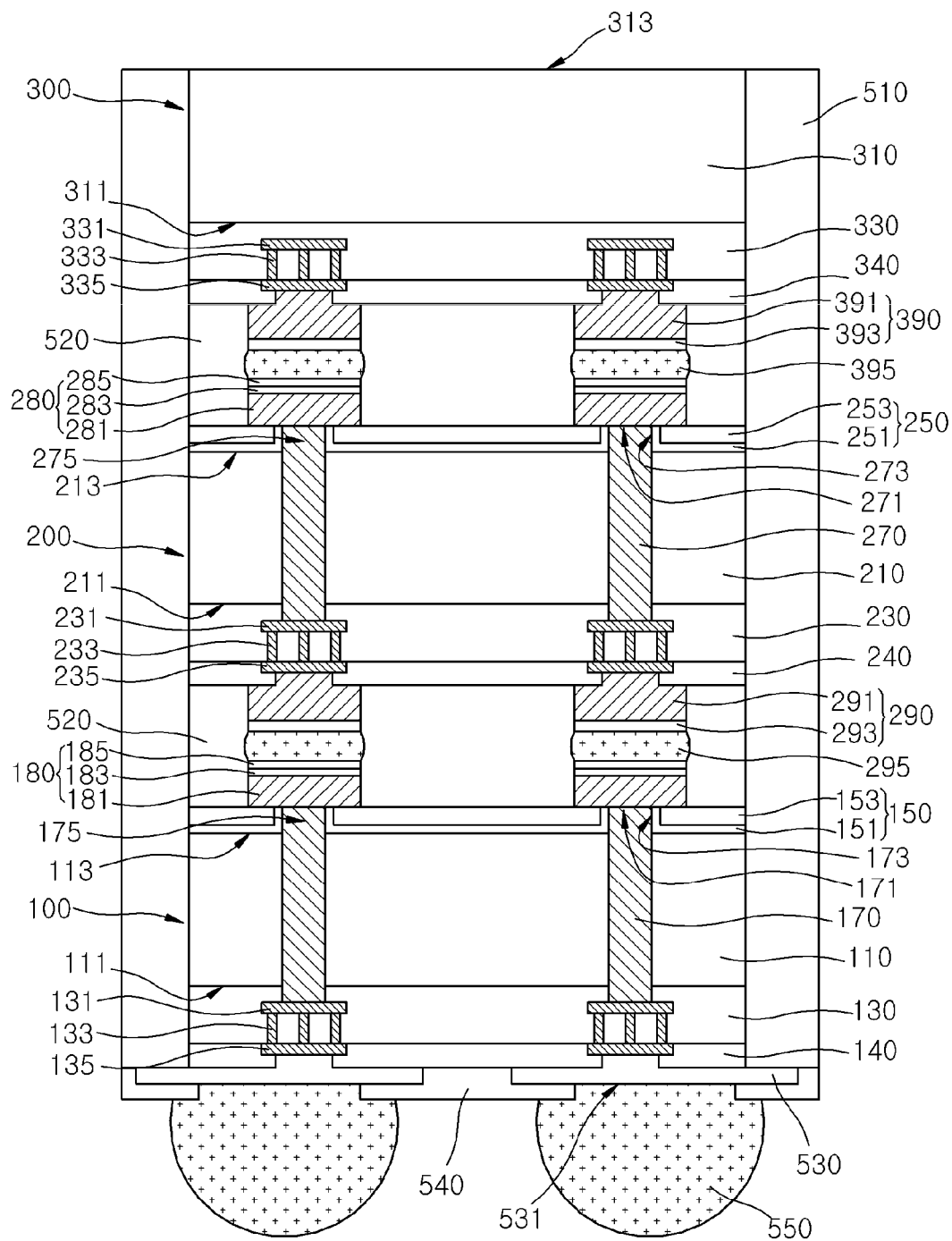
FIG. 1 is a cross-sectional view illustrating a stack package according to an embodiment.

Embodiments may provide stack packages including a plurality of stacked chips electrically connected by through via electrodes and methods of manufacturing the stack packages. Each of the stack packages may include outer connection terminals, and the outer connection terminals may be arrayed on a bottom surface of a lowermost chip of the stacked chips as well as on a bottom surface of a molding member covering sidewalls of the stacked chips. That is, the bottom surface of the molding member may be utilized as a portion of a total bottom surface of the stack package. Thus, even though a width of the lowermost chip is reduced, the outer connection terminals may be easily arrayed on the total bottom surface of the stack package without reduction of spaces between the outer connection terminals or reduction of width of the outer connection terminals.

It will be understood that although the terms first, second, third etc. may be used herein to describe various elements, these elements should not be construed in a restrictive manner. These terms are only used to distinguish one element from another element. Thus, a first element in some embodiments could be referred to as a second element in other embodiments.

It will also be understood that when an element is referred to as being "on," "above," "below," or "under" another element, it can be directly "on," "above," "below," or "under" the other element, respectively, or intervening elements may also be present. Accordingly, the terms such as "on," "above," "below," or "under" which are used herein are for an illustrative purpose only and are not intended to limit the embodiments.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion. The semiconductor substrate may have an active layer corresponding to a region where transistors and internal interconnection lines constituting electronic circuits are integrated. The semiconductor chips may be obtained by separating the semiconductor substrate into a plurality of pieces using a die sawing process.

The semiconductor chips may include memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits which are integrated on and/or in the semiconductor substrate. The logic chip may include logic circuits which are integrated on and/or in the semiconductor substrate. In some cases, the term "semiconductor substrate" used herein may be construed as a semiconductor chip or a semiconductor die in which integrated circuits are formed.

Referring to FIG. 1, a stack package 10 according to the present embodiment may be configured to include a stack structure having a plurality of semiconductor chips 100, 200, and 300 sequentially stacked, a molding member 510 covering and protecting sidewalls of the stack structure, and outer connection terminals 550 for electrically connecting the stack structure to an external device or system. The semiconductor chips 100, 200, and 300 may be electrically connected to each other by a through via connection structure.

Figure 2:
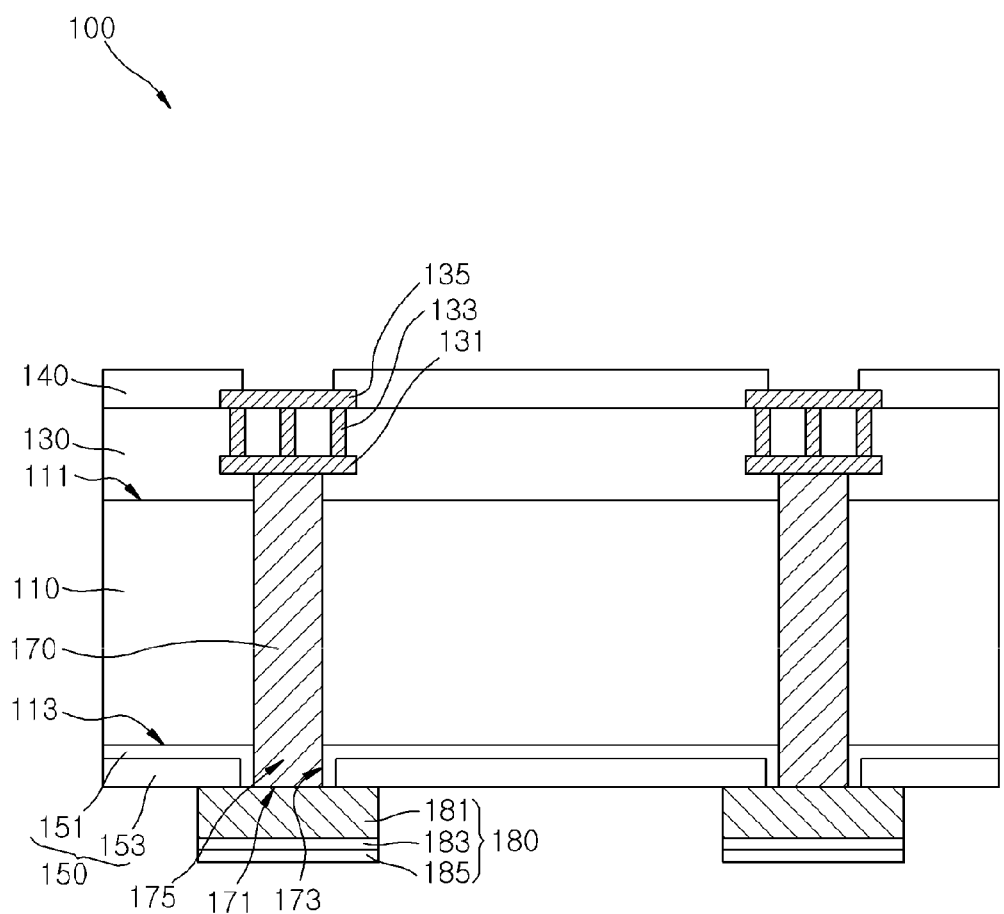
FIGS. 2 to 4 are cross-sectional views illustrating various semiconductor chips constituting stack packages according to an embodiment.

Referring to FIGS. 1 and 2, the lower semiconductor chip 100 may include a lower semiconductor substrate 110 and lower through via electrodes 170 penetrating the lower semiconductor substrate 110. The lower through via electrodes 170 may constitute the through via connection structure of the stack package 10. Each of the lower through via electrodes 170 may include a conductive pillar that extends from a front side surface 111 of the lower semiconductor substrate 110 toward a backside surface 113 of the lower semiconductor substrate 110.

Each of the lower through via electrodes 170 may include a diffusible metal material, for example, a copper (Cu) material, a tin (Sn) material, a silver (Ag) material, an alloy material containing at least two of the above-listed materials. In some embodiments, each of the lower through via electrodes 170 may include a gallium (Ga) material, an indium (In) material, a tin (Sn) material, a mercury (Hg) material, a bismuth (Bi) material, a lead (Pb) material, a gold (Au) material, a zinc (Zn) material, an aluminum (Al) material, or an alloy material containing at least two of the above-listed materials. Although not shown in the drawings, an insulation liner may be disposed between the lower through via electrodes 170 and the lower semiconductor substrate 110.

Figure 5:
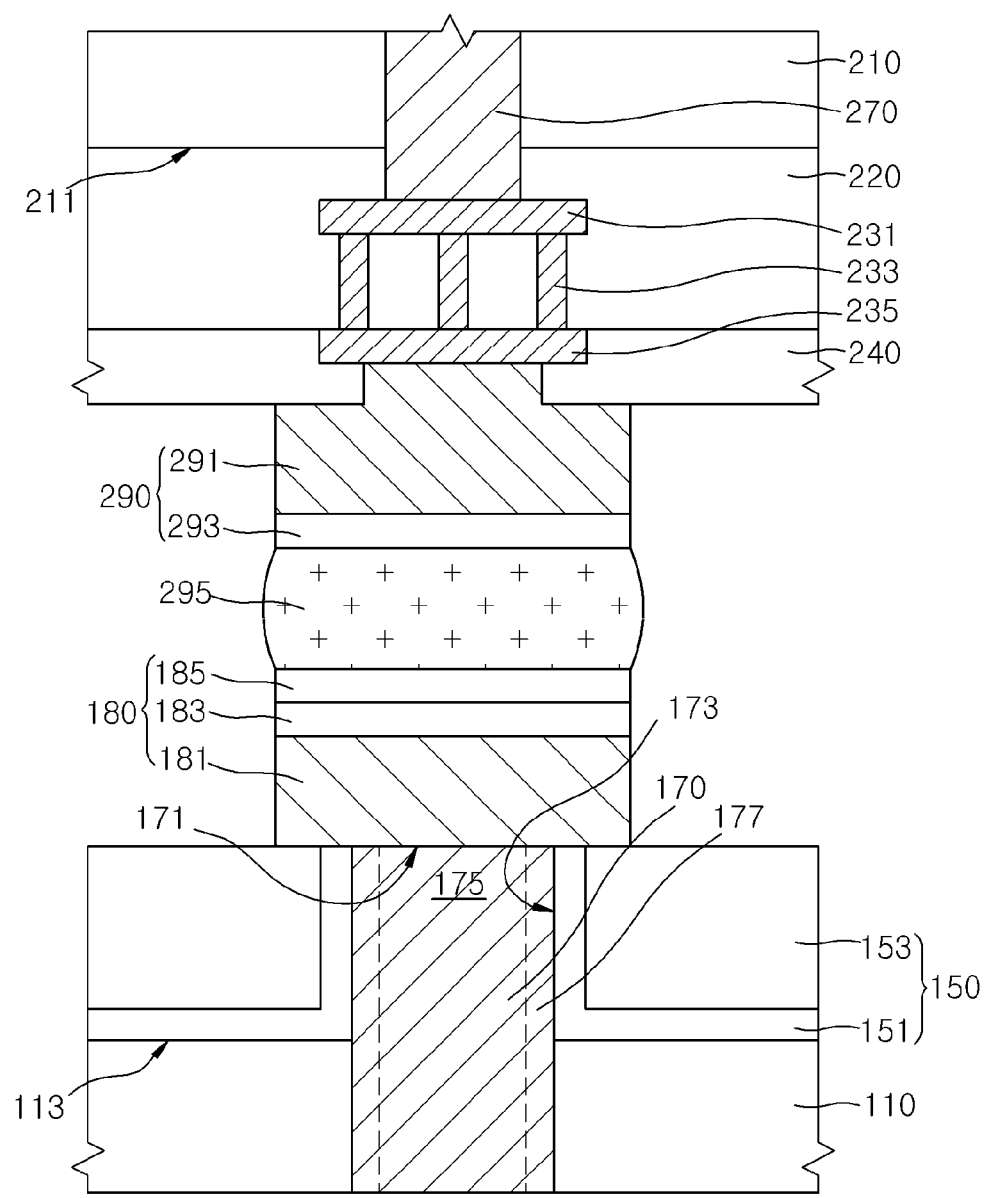
FIG. 5 is a cross-sectional view illustrating an interconnection structure between semiconductor chips constituting a stack package according to an embodiment.

A barrier metal layer may be disposed between the lower semiconductor substrate 110 and the lower through via electrodes 170. More specifically, the barrier metal layer may be disposed between the insulation liner and the lower through via electrodes 170. The barrier metal layer may prevent metal atoms in the lower through via electrodes 170, from diffusing into the lower semiconductor substrate 110. For example, the barrier metal layer may include a titanium (Ti) material, a tantalum (Ta) material, a tungsten (W) material, a titanium nitride (TiN) material, a tantalum nitride (TaN) material, a tungsten nitride (WN) material, a tantalum silicon nitride (TaSiN) material, a titanium silicon nitride (TiSiN) material, a tungsten silicon nitride (WSiN) material, a manganese (Mn) material, a ruthenium (Ru) material, or an alloy material including at least two of the above-listed materials. As illustrated in FIG. 5, the lower through via electrodes 170 may be formed to include a metal material such as a copper material, and the barrier metal layer 177 may be formed to surround a sidewall of the lower through via electrode 170. Although not shown in the drawings, the insulation liner may be disposed between the barrier metal layer 177 and the lower semiconductor substrate 110 to electrically insulate the lower through via electrode 170 from the lower semiconductor substrate 110.

The lower semiconductor substrate 110 may be a silicon substrate, and the front side surface 111 of the lower semiconductor substrate 110 may correspond to a surface of an active layer in which integrated circuits constituting a semiconductor device such as a memory semiconductor device are formed. The backside surface 113 of the lower semiconductor substrate 110 may be opposite to the front side surface 111. Circuit elements such as transistors constituting the integrated circuits may be disposed in and/or on the active layer, and an interlayer insulation layer 130 and internal interconnection structures 131 and 133 in the interlayer insulation layer 130 may be disposed on the front side surface 111 of the lower semiconductor substrate 110.

The internal interconnection structures 131 and 133 may include interconnection lines electrically connected to the transistors, and the lower through via electrodes 170 may be electrically connected to the circuit elements constituting the integrated circuits through the internal interconnection structures 131 and 133. The internal interconnection structures 131 and 133 may include interconnection lines and connection vias connected to the interconnection lines. The interconnection lines and the connection vias may electrically connect the lower through via electrodes 170 to chip contact portions 135 acting as contact pads. A front side passivation layer 140 may be disposed on the interlayer insulation layer 130 to expose the chip contact portions 135. The front side passivation layer 140 may include a silicon oxide layer, a silicon nitride (SiN) layer or a combination thereof.

The outer connection terminals 550 may be electrically connected to respective ones of the chip contact portions 135 of the lower semiconductor chip 100 corresponding to a lowermost chip of the stack package 10, as illustrated in FIG. 1.

Since the chip contact portions 135 of the lower semiconductor chip 100 are connected to the outer connection terminals 550, the lower semiconductor chip 100 may be upside down.

Referring again to FIGS. 1 and 2, the lower through via electrodes 170 may substantially penetrate a body of the lower semiconductor substrate 110 and include protrusion portions 175 protruding from the backside surface 113 of the lower semiconductor substrate 110. The protrusion portions 175 of the lower through via electrodes 170 may penetrate a backside passivation layer 150 covering the backside surface 113 of the lower semiconductor substrate 110 such that top surfaces 171 of the protrusion portions 175 are exposed. The exposed top surfaces 171 of the protrusion portions 175 may be covered with lower backside bumps 180.

The backside passivation layer 150 may include first and second backside insulation layers 151 and 153. The first backside insulation layer 151 may be disposed on the backside surface 113 to cover sidewalls of the protrusion portions 175 of the lower through via electrodes 170. The first backside insulation layer 151 may have a conformal liner shape to cover the backside surface 113 and the sidewalls of the protrusion portions 175. The second backside insulation layer 153 may be disposed on the first backside insulation layer 151. The second backside insulation layer 153 may include a different insulation layer from the first backside insulation layer 151. A surface of the backside passivation layer 150 may level with the top surfaces 171 of the protrusion portions 175.

The first backside insulation layer 151 may be disposed to directly cover the entire sidewalls of the protrusion portions 175. The first backside insulation layer 151 may act as a diffusion barrier layer that prevents metal atoms (e.g., copper atoms) in the protrusion portions 175 from diffusing or moving out. The first backside insulation layer 151 acting as a diffusion barrier layer may include a silicon nitride layer or a silicon oxide layer to efficiently block the migration of metal atoms or metal ions. If metal ions such as copper ions in the protrusion portions 175 are diffused out, the diffused copper ions may react with silicon atoms in the second backside insulation layer 153 to form a copper-silicon compound material. In particular, if metal ions such as copper ions in the protrusion portions 175 are diffused into the lower semiconductor substrate 110, the diffused metal ions may cause an abnormal operation of the transistors formed in the lower semiconductor substrate 110. For example, if metal ions such as copper ions in the protrusion portions 175 are diffused into the lower semiconductor substrate 110, the diffused copper ions may degrade a threshold voltage characteristic and/or a leakage current characteristic of the transistors formed in the lower semiconductor substrate 110. Thus, if the lower semiconductor chip 100 is a DRAM device, a refresh characteristic of the lower semiconductor chip 100 may be degraded. Thus, the first backside insulation layer 151 acting as a diffusion barrier layer may prevent the lower semiconductor chip 100 from being contaminated by metal ions such as copper ions.

As described above, the first backside insulation layer 151 of the backside passivation layer 150 may have a liner shape that conformally covers the sidewalls of the protrusion portions 175 and the backside surface 113 of the lower semiconductor substrate 110. Thus, the first backside insulation layer 151 may have concave shapes between the protrusion portions 175. The second backside insulation layer 153 may fill spaces defined by the concave shapes of the first backside insulation layer 151 to form a flat surface of the backside passivation layer 150. Accordingly, the surface of the backside passivation layer 150 may level with the top surfaces 171 of the protrusion portions 175. Further, the second backside insulation layer 153 may act as an insulation buffer layer that alleviates a stress applied to the backside passivation layer 150. Thus, the second backside insulation layer 153 may reduce the stress applied to the backside passivation layer 150 to enhance the mechanical reliability of bump structures between semiconductor chips 100, 200 and 300. The second backside insulation layer 153 acting as an insulation buffer layer may include a silicon oxide layer.

The lower backside bumps 180 may be disposed to directly contact the top surfaces 171 of the protrusion portions 175 that penetrate the backside passivation layer 150. Each of the lower backside bumps 180 may include a backside bump body 181 contacting the top surface 171 of the protrusion portion 175, a wetting layer 183 contacting the backside bump body 181, and an oxidation resistant layer 185 contacting the wetting layer 183. The backside bump body 181 may include copper, the wetting layer 183 may include nickel, and the oxidation resistant layer 185 may include gold. In some embodiments, each of the lower backside bumps 180 may include only the backside bump body 181 and the wetting layer 183. The protrusion portion 175 and the backside bump body 181 may contact each other to have a "T"-shaped configuration when viewed from a cross-sectional view. That is, the lower backside bumps 180 may have a width which is greater than a width of the protrusion portions 175. As a result, contact regions of bump structures between the semiconductor chips 100 and 200 may be increased. The intermediate semiconductor chip 200 may be stacked on the lower semiconductor chip 100 such that intermediate front side bumps (290 of FIG. 1) of the intermediate semiconductor chip 200 are combined with respective ones of the lower backside bumps 180.

Figure 3:
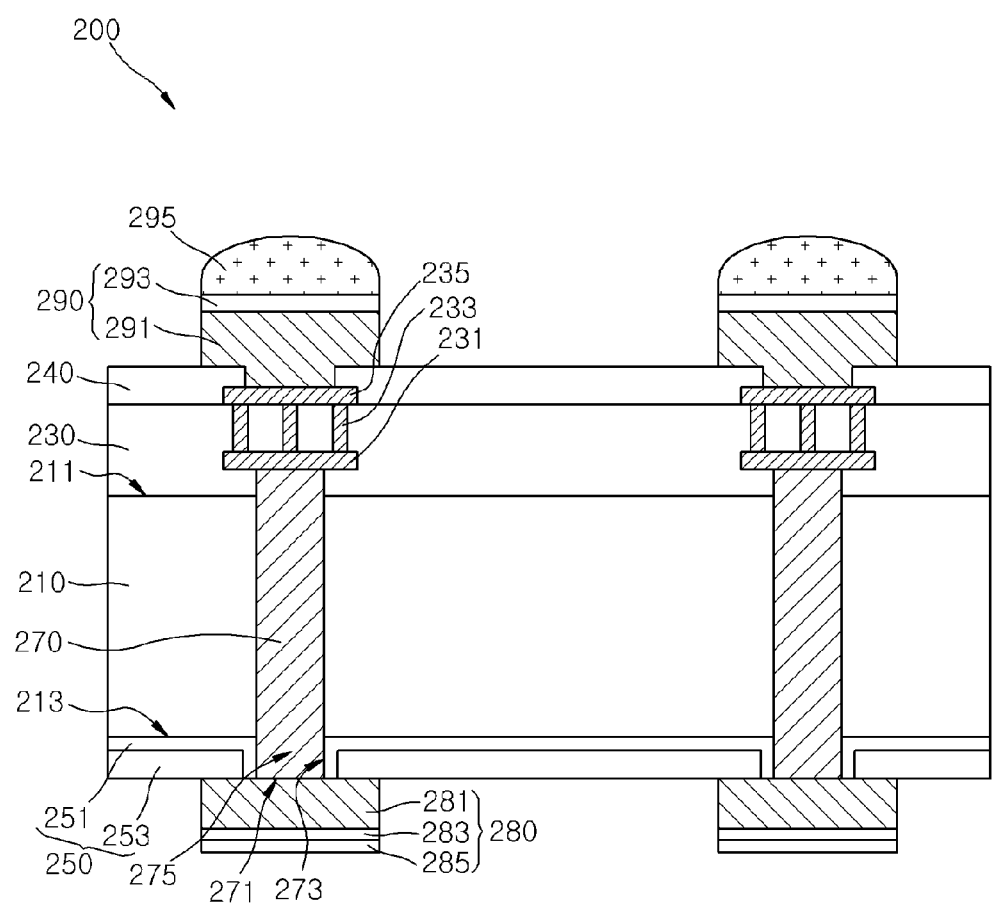

Referring to FIGS. 1 and 3, the intermediate semiconductor chip 200 stacked on the lower semiconductor chip 100 may have substantially the same function as the lower semiconductor chip 100. Further, the intermediate semiconductor chip 200 may have the same configuration as the lower semiconductor chip 100. The intermediate semiconductor chip 200 may further include front side bumps 290 (i.e., intermediate front side bumps) unlike the lower semiconductor chip 100. The intermediate front side bumps 290 may constitute the bump structures between the lower semiconductor chip 100 and the intermediate semiconductor chip 200.

The intermediate semiconductor chip 200 may include an intermediate semiconductor substrate 210 and intermediate through via electrodes 270 penetrating the intermediate semiconductor substrate 210. The intermediate through via electrodes 270 may constitute the through via connection structure of the stack package 10. Each of the intermediate through via electrodes 270 may correspond to a conductive pillar that extends from a front side surface 211 of the intermediate semiconductor substrate 210 toward a backside surface 213 of the intermediate semiconductor substrate 210. The front side surface 211 of the intermediate semiconductor substrate 210 may correspond to a surface of an active layer disposed in the intermediate semiconductor substrate 210, and the backside surface 213 of the intermediate semiconductor substrate 210 may be opposite to the front side surface 211 of the intermediate semiconductor substrate 210. An interlayer insulation layer 230 and internal interconnection structures 231 and 233 in the interlayer insulation layer 230 may be disposed on the front side surface 211 of the intermediate semiconductor substrate 210.

The internal interconnection structures 231 and 233 may include interconnection lines and connection vias electrically connected to the interconnection lines. The internal interconnection structures 231 and 233 may electrically connect the intermediate through via electrodes 270 to chip contact portions 235 serving as contact pads. A front side passivation layer 240 may be disposed on the interlayer insulation layer 230 to expose the chip contact portions 235, and the intermediate front side bumps 290 may be disposed on respective ones of the exposed chip contact portions 235.

Each of the intermediate front side bumps 290 may include a front side bump body 291 contacting the chip contact portion 235 and a wetting layer 293 stacked on the front side bump body 291. The front side bump body 291 may include, for example, a copper material, and the wetting layer 293 may include, for example, a nickel material. Conductive adhesives 295 (for example, solder layers) may be disposed on the respective wetting layers 293. The conductive adhesives 295 may be combined with the lower backside bumps (180 of FIG. 1).

Each of the intermediate through via electrodes 270 may penetrate the intermediate semiconductor substrate 210 and include a protrusion portion 275 that protrudes from the backside surface 213 of the intermediate semiconductor substrate 210, and the protrusion portions 275 may penetrate a backside passivation layer 250 covering the backside surface 213 of the intermediate semiconductor substrate 210 such that top surfaces 271 of the protrusion portions 275 are exposed. Each of the exposed top surfaces 271 of the protrusion portions 275 may be covered with an intermediate backside bump 280. The backside passivation layer 250 may include a first backside insulation layer 251 and a second backside insulation layer 253, and the backside passivation layer 250 may be disposed on the backside surface 213 of the intermediate semiconductor substrate 210 and surround sidewalls of the protrusion portions 275. The first backside insulation layer 251 may serve as a diffusion barrier layer, and the second backside insulation layer 253 may serve as an insulation buffer layer.

At least one additional intermediate semiconductor chip may be stacked on the intermediate semiconductor chip 200. The additional intermediate semiconductor chip may have the same function and structure as the intermediate semiconductor chip 200. In some embodiments, the intermediate semiconductor chip 200 may have a greater or smaller size than the lower semiconductor chip 100.

Figure 4:
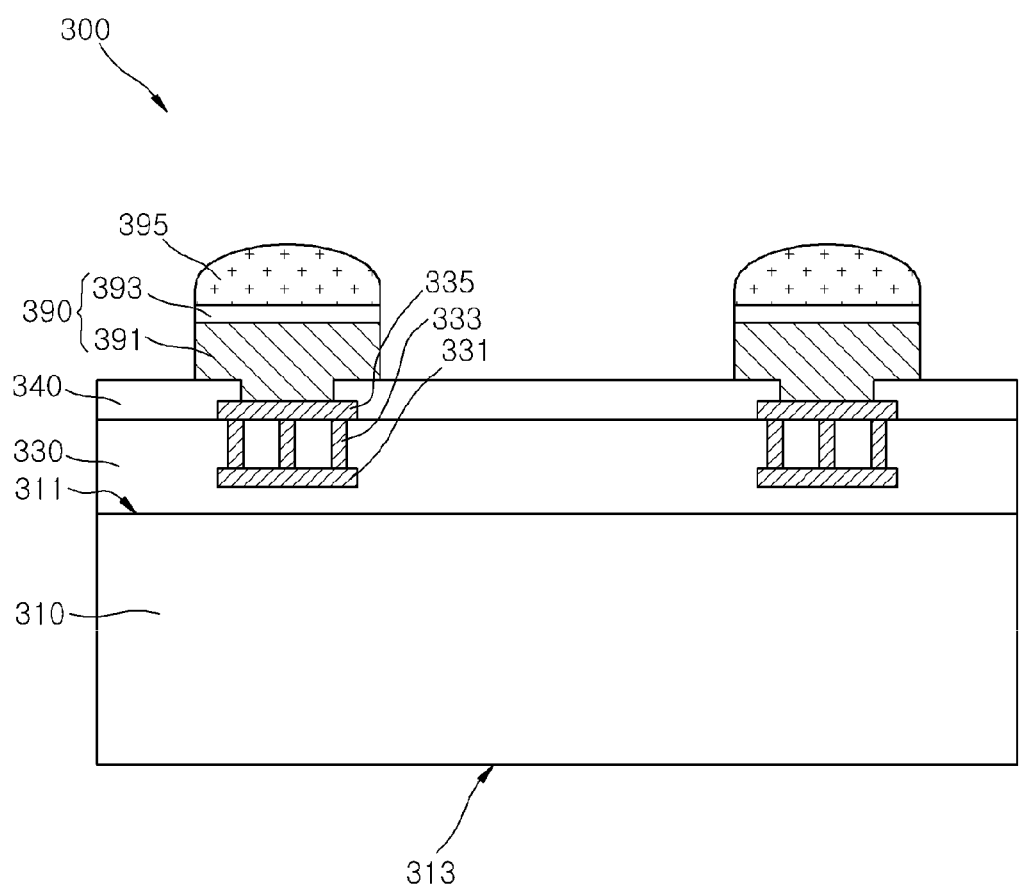

Referring to FIGS. 1 and 4, the upper semiconductor chip 300 may be stacked on the intermediate semiconductor chip 200. The upper semiconductor chip 300 may have the same function as the lower semiconductor chip 100 or the intermediate semiconductor chip 200. The upper semiconductor chip 300 may have the same configuration as the lower semiconductor chip 100 or the intermediate semiconductor chip 200. However, the upper semiconductor chip 300 may not include any through via electrodes, unlike the lower semiconductor chip 100 and the intermediate semiconductor chip 200. The upper semiconductor chip 300 may have a greater or smaller size than the lower semiconductor chip 100.

The upper semiconductor chip 300 may include an upper semiconductor substrate 310, and the upper semiconductor substrate 310 may include a front side surface 311 and a backside surface 313 which are opposite to each other. The front side surface 311 may correspond to a surface of an active layer disposed in the upper semiconductor substrate 310. An interlayer insulation layer 330 and internal interconnection structures 331 and 333 in the interlayer insulation layer 330 may be disposed on the front side surface 311 of the upper semiconductor substrate 310. The internal interconnection structures 331 and 333 may include interconnection lines and connection vias electrically connected to the interconnection lines. The internal interconnection structures 331 and 333 may be electrically connected to chip contact portions 335 serving as contact pads. A front side passivation layer 340 may be disposed on the interlayer insulation layer 330 to expose the chip contact portions 335, and upper front side bumps 390 may be disposed on respective ones of the exposed chip contact portions 335. Each of the upper front side bumps 390 may include a front side bump body 391 contacting the chip contact portion 335 and a wetting layer 393 stacked on the front side bump body 391. The front side bump body 391 may include, for example, a copper material, and the wetting layer 393 may include, for example, a nickel material. Conductive adhesives 395, for example, solder layers may be disposed on respective ones of the wetting layers 393. The conductive adhesives 395 may be combined with the intermediate backside bumps (280 of FIG. 1).

The molding member 510 may cover the sidewalls of the semiconductor chips 100, 200 and 300 and expose the backside surface 313 of the upper semiconductor substrate 310. In some embodiments, the molding member 510 may extend to cover the backside surface 313 of the upper semiconductor substrate 310. If the backside surface 313 of the upper semiconductor substrate 310 is exposed by the molding member 510, the heat radiation efficiency of the stack package 10 could be enhanced. The heat generated in the stack package 10 may be readily radiated through the exposed backside surface 313.

Referring to FIGS. 1 and 5, the semiconductor chips 100, 200 and 300 may be electrically connected to each other by the through via connection structure that provides vertical electric signal paths. Thus, a horizontal width of the stack package 10 may be minimized. The through via connection structure may be configured to include the through via electrodes 170 and 270 which are electrically connected to each other. The through via electrodes 170 may be electrically connected to the through via electrodes 270 by the bump structures. As illustrated in FIG. 5, the lower backside bump 180 connected to the lower through via electrode 170 of the lower semiconductor chip 100 may be vertically aligned with the intermediate front side bump 290 of the intermediate semiconductor chip 200, and the lower backside bump 180 and the intermediate front side bump 290 may be combined with each other by the conductive adhesive 295 such as a solder layer such that the intermediate semiconductor chip 200 is stacked on the lower semiconductor chip 100.

As illustrated in FIG. 1, neighboring bump structures including the lower backside bumps 180 and the intermediate front side bumps 290 may be electrically insulated from each other by an insulation chip adhesive 520 disposed between the lower semiconductor chip 100 and the intermediate semiconductor chip 200. The insulation chip adhesive 520 may be provided in an adhesive film form or may be formed by injecting a liquid adhesive material. Alternatively, the insulation chip adhesive 520 may be formed together with the molding member 510 while the molding member 510 is formed.

Referring again to FIG. 1, the stack package 10 may include the outer connection terminals 550 electrically connected to the chip contact portions 135 that are disposed on the front side surface 111 of the lower semiconductor chip 100, which are exposed by the molding member 510. The molding member 510 may be formed to include an epoxy molding compound (EMC) material. The molding member 510 may be formed to cover only the sidewalls of the stack structure having the semiconductor chips 100, 200 and 300 sequentially stacked. That is, the molding member 510 may expose a front side surface of the lower semiconductor chip 100, for example, the chip contact portions 135 and the front side passivation layer 140.

The outer connection terminals 550 may be configured to include a plurality of solder balls which are two dimensionally arrayed. The outer connection terminals 550 may be disposed on a front side surface of the lower semiconductor chip 100 as well as on a bottom surface of the molding member 510. That is, the outer connection terminals 550 may be disposed even on the bottom surface of the molding member 510. Thus, an area of a surface on which the outer connection terminals 550 are arrayed can be maximized. As a result, even though a width of the lower semiconductor chip 100 is reduced, an area where the outer connection terminals 550 are provided, can be secured.

In order to allow the outer connection terminals 550 to be arrayed even on the bottom surface of the molding member 510, redistribution lines 530 electrically connected to the respective chip contact portions 135 may extend onto the bottom surface of the molding member 510. The redistribution lines 530 may be formed by depositing and patterning a metal material which extends onto the bottom surface of the molding member 510. The redistribution lines 530 may be covered with an insulation layer 540, and the insulation layer 540 may be patterned to expose package contact portions 531 (i.e., ball land portions) of the redistribution lines 530. The outer connection terminals 550 may be attached to respective ones of the exposed package contact portions 531.

The stack package 10 may be configured to have favorable heat radiation efficiency because the backside surface 313 of the upper semiconductor chip 300 is exposed. Further, the outer connection terminals 550 (including, for example, solder balls) may be arrayed even on the molding member 510 to increase the room for layout of the outer connection terminals 550 or to increase the number of the outer connection terminals 550.

Figure 6:
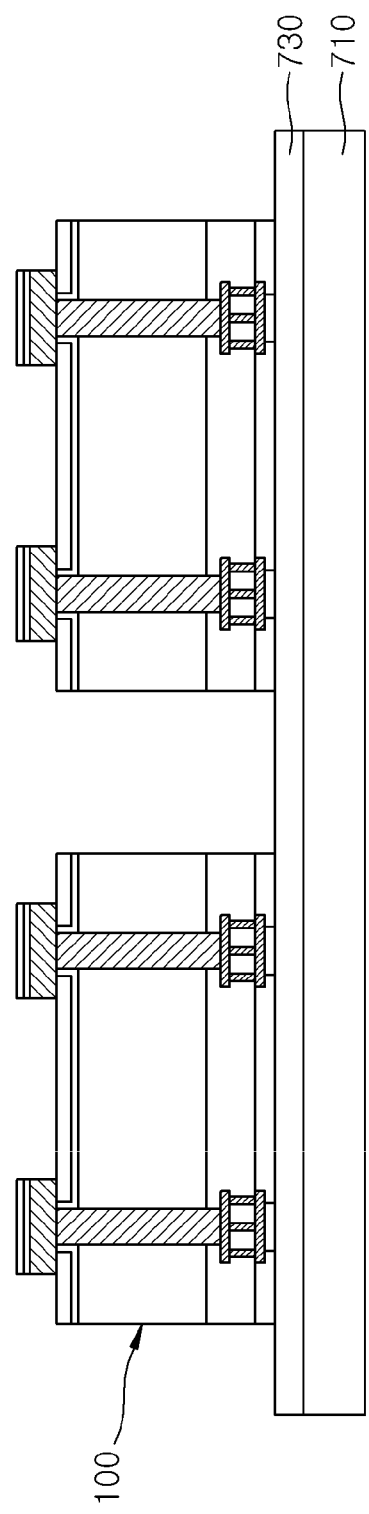
FIGS. 6 to 12 are cross-sectional views illustrating a method of manufacturing a stack package according to an embodiment.

Referring to FIG. 6, lower semiconductor chips 100 may be mounted on a subsidiary substrate 710 and may be spaced apart from each other. The subsidiary substrate 710 may be a carrier substrate. The subsidiary substrate may be a glass substrate or a silicon substrate. Each of the lower semiconductor chips 100 may be provided to include lower through via electrodes (170 of FIG. 1 or 2), as described with reference to FIG. 2. The lower semiconductor chips 100 may be mounted on a subsidiary substrate 710 such that front side surfaces (111 of FIG. 2) of the lower semiconductor chips 100 face the subsidiary substrate 710. The lower semiconductor chips 100 may be fixed to the subsidiary substrate 710 by an adhesive tape 730 attached to the subsidiary substrate 710.

Figure 7:
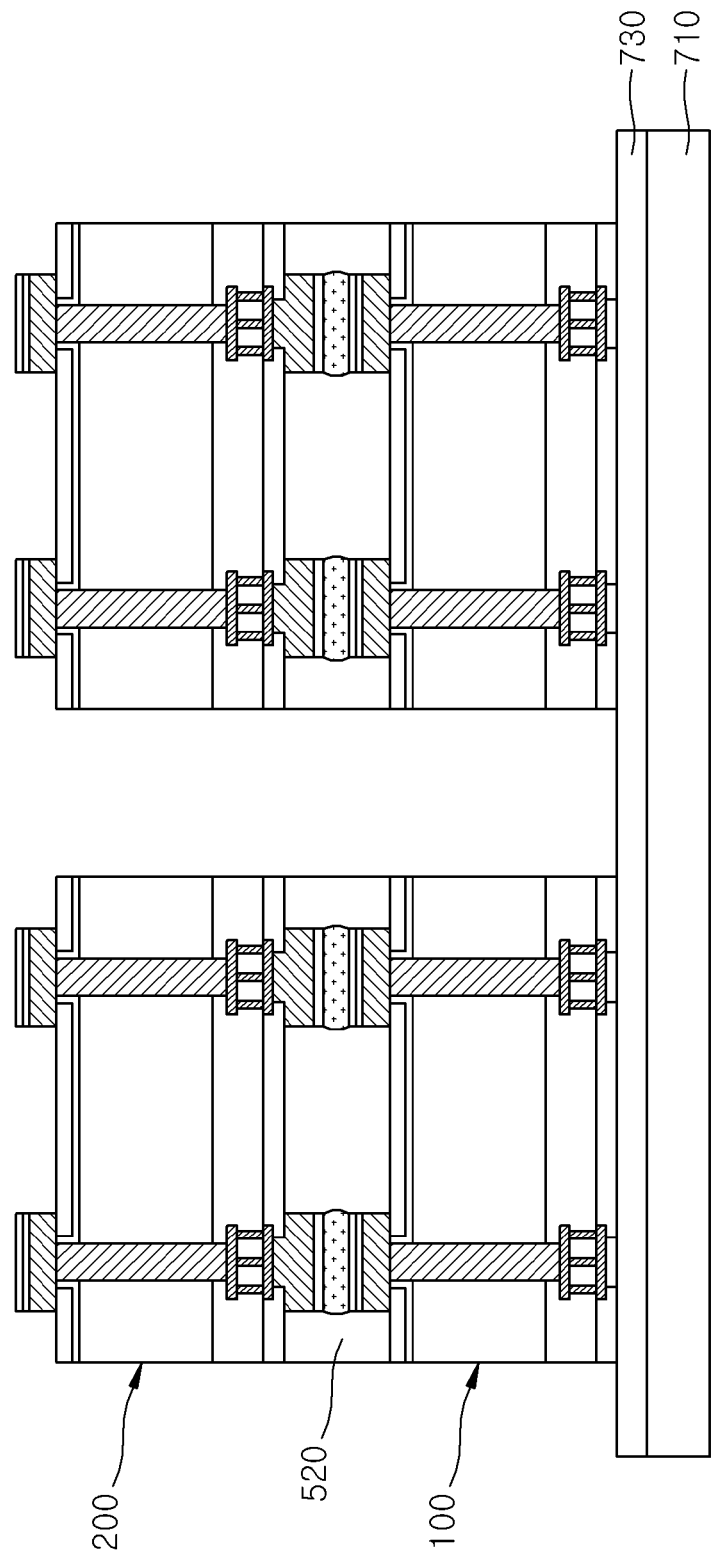

Referring to FIG. 7, intermediate semiconductor chips 200 may be stacked on the respective lower semiconductor chips 100. The intermediate semiconductor chips 200 may be combined with the lower semiconductor chips 100 using a bump combination process. The bump combination process may be performed such that intermediate front side bumps 290 of the intermediate semiconductor chips 200 are combined with lower backside bumps 180 of the lower semiconductor chips 100, as illustrated in FIG. 5. An insulation chip adhesive 520 may be introduced into a gap region between the lower semiconductor chips 100 and the intermediate semiconductor chips 200.

Figure 8:
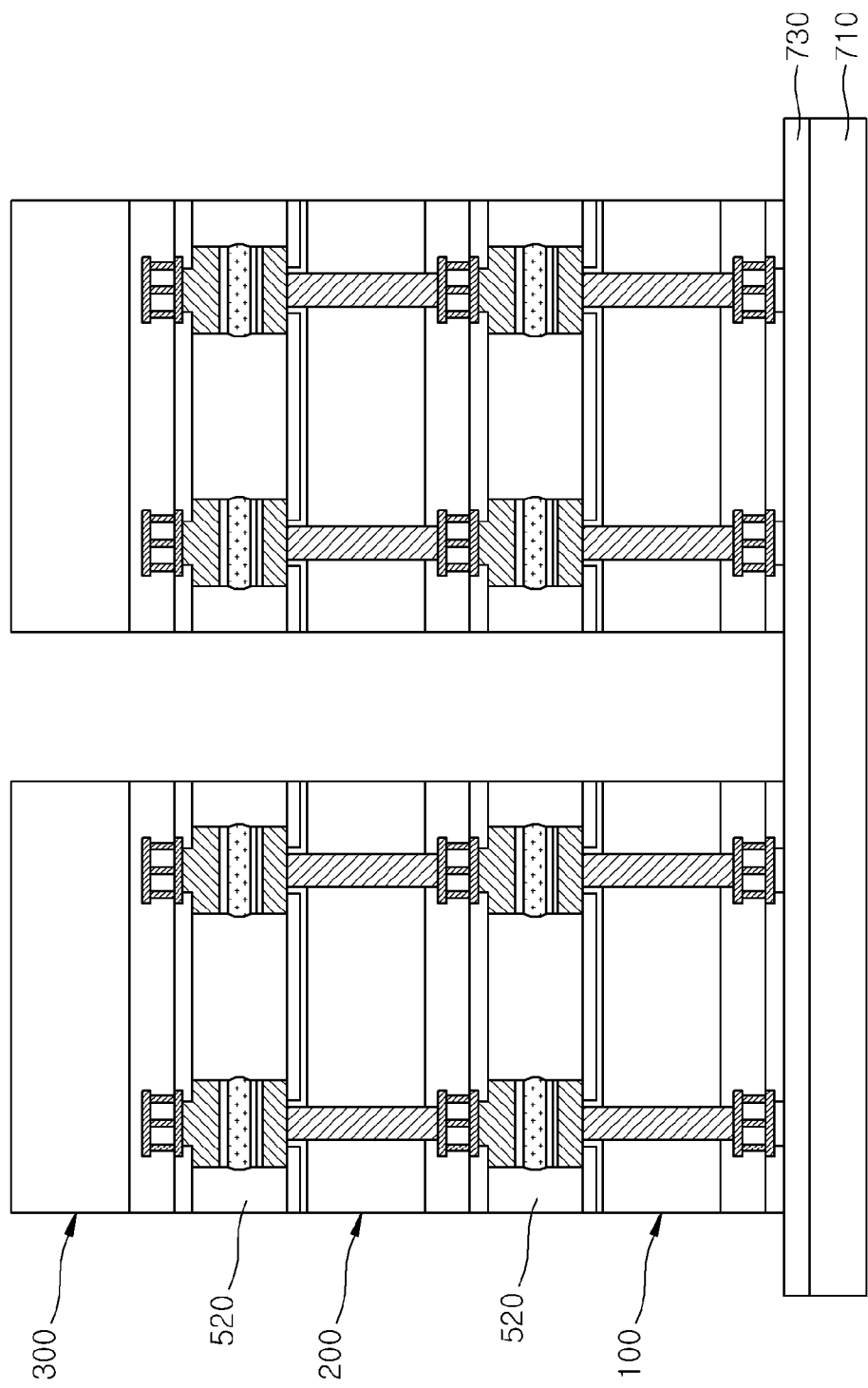

Referring to FIG. 8, upper semiconductor chips 300 may be stacked on the respective intermediate semiconductor chips 200. In some embodiments, at least one additional intermediate semiconductor chip may be stacked on each of the intermediate semiconductor chips 200 before the upper semiconductor chips 300 are stacked. The additional intermediate semiconductor chips may have substantially the same function as the intermediate semiconductor chips 200. Alternatively, the additional intermediate semiconductor chips may have a function or configuration different from the intermediate semiconductor chips 200. The lower semiconductor chips 100, the intermediate semiconductor chips 200, and the upper semiconductor chips 300 may constitute a plurality of stack structures. That is, each of the stack structures may include the lower semiconductor chip 100, the intermediate semiconductor chip 200, and the upper semiconductor chip 300 which are sequentially stacked. The stack structures may be disposed on the subsidiary substrate 710 to be spaced apart from each other.

Figure 9:
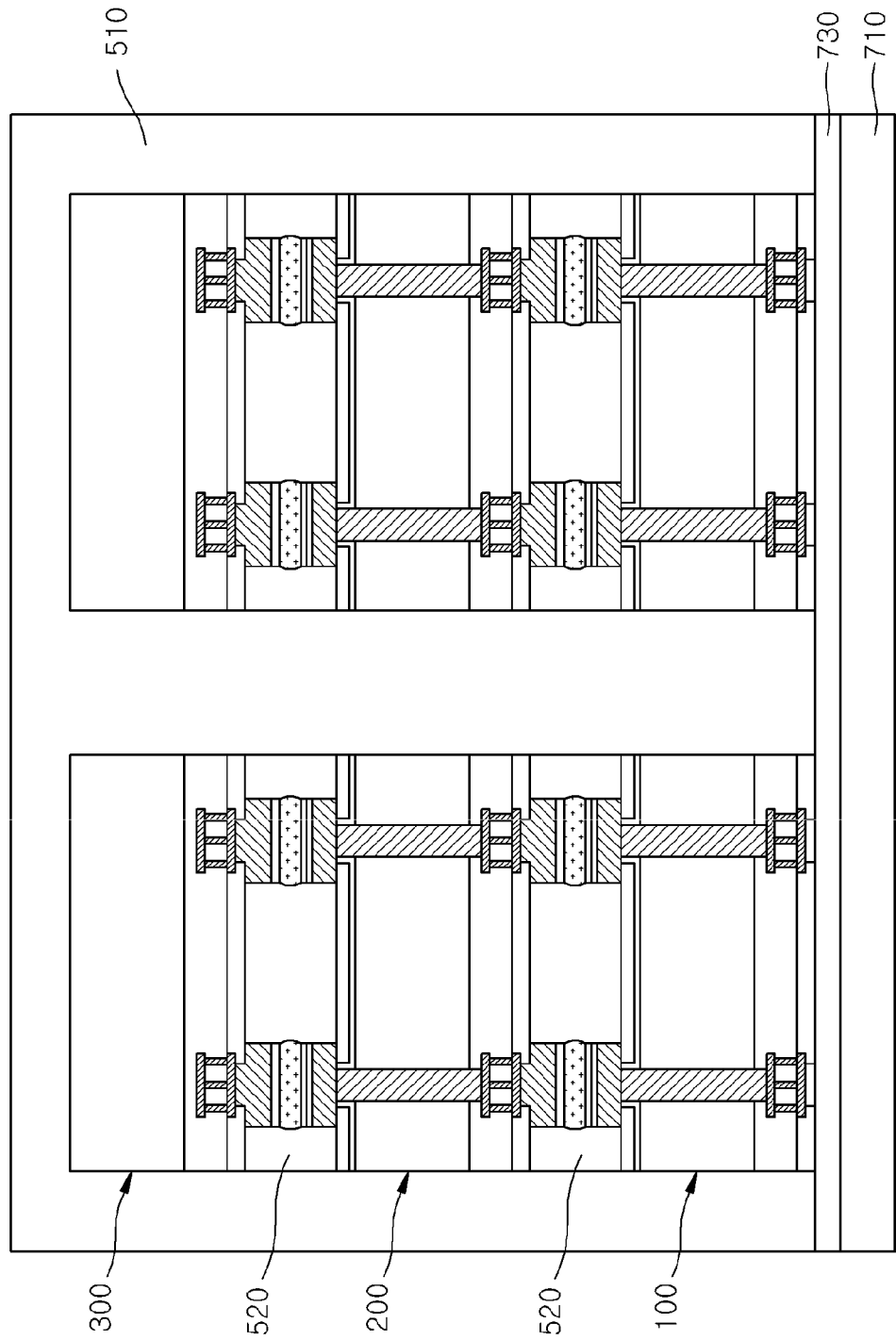

Referring to FIG. 9, a molding member 510 may be formed on the subsidiary substrate 710 to cover the stack structures including the lower semiconductor chip 100, the intermediate semiconductor chip 200, and the upper semiconductor chip 300.

Figure 10:
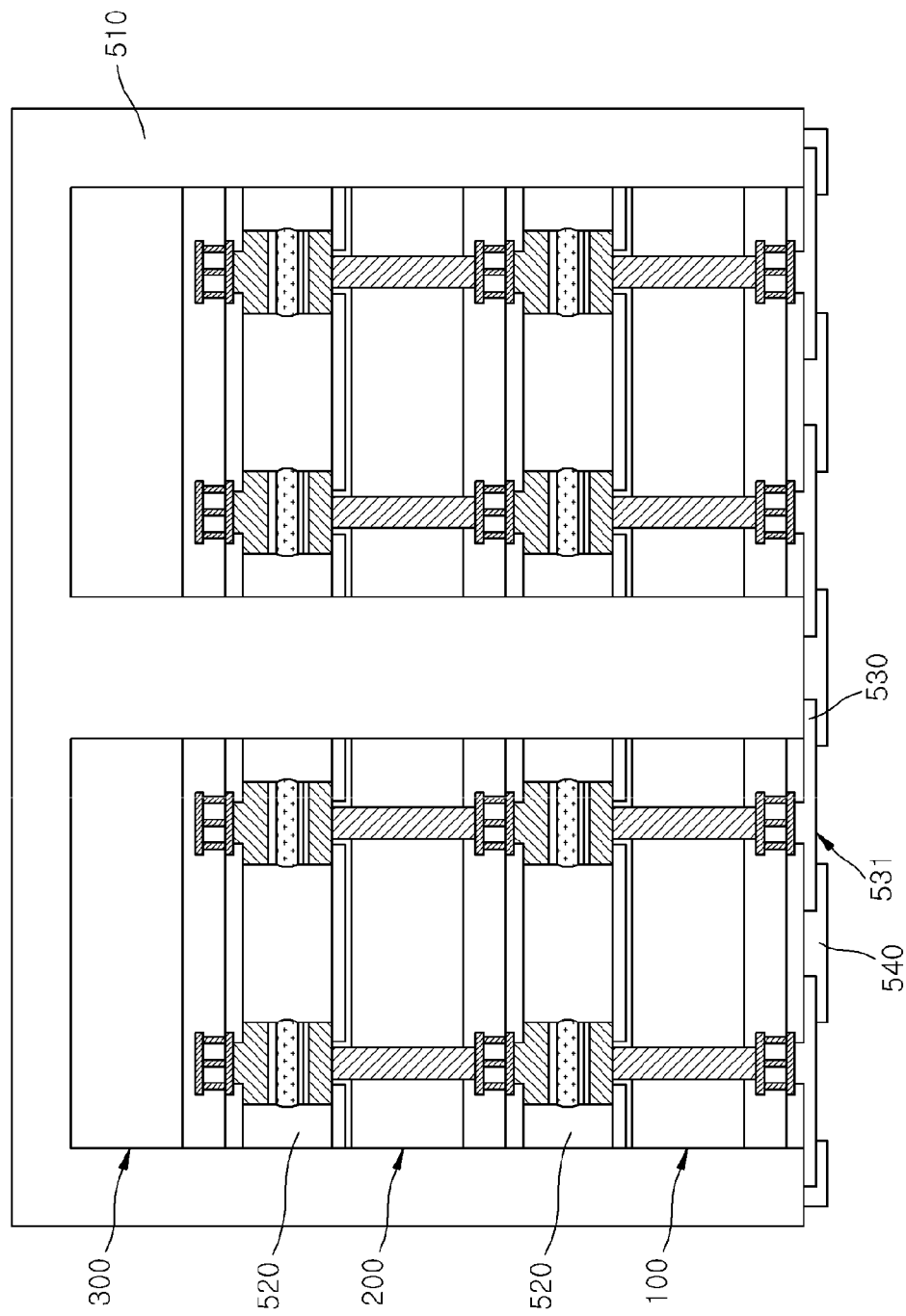

Referring to FIGS. 2 and 10, the subsidiary substrate 710 and the adhesive tape 730 may be detached from the lower semiconductor chips 100 to expose front side surfaces of the lower semiconductor chips 100. Redistribution lines 530 may be formed on the exposed front side surfaces of the lower semiconductor chips 100. That is, the redistribution lines 530 may be formed on the chip contact portions (135 of FIG. 2), the front side passivation layer (140 of FIG. 2), and a bottom surface of the molding member 510. The redistribution lines 530 may be formed by depositing a metal material on the exposed front side surfaces of the lower semiconductor chips 100 to form a metal layer and by patterning the metal layer. An insulation layer 540 may be formed to cover the redistribution lines 530, and the insulation layer 540 may be patterned to expose package contact portions 531 (i.e., ball landing portions) of the redistribution lines 530. At least one among the package contact portions 531 of the redistribution lines 530 connected to each of the lower semiconductor chips 100 may extend over the bottom surface of the molding member 510.

As described above, the plurality of stack structures may be two-dimensionally arrayed and top surfaces and sidewalls of the stack structures may be covered with the molding member 510. Thus, a process for forming the redistribution lines 530 on the bottom surface of the molding member 510 and the front surfaces of the lower semiconductor chips 100 can be applied to all the stack structures at a time as if a package process is applied to all semiconductor chips formed on a wafer.

Figure 11:
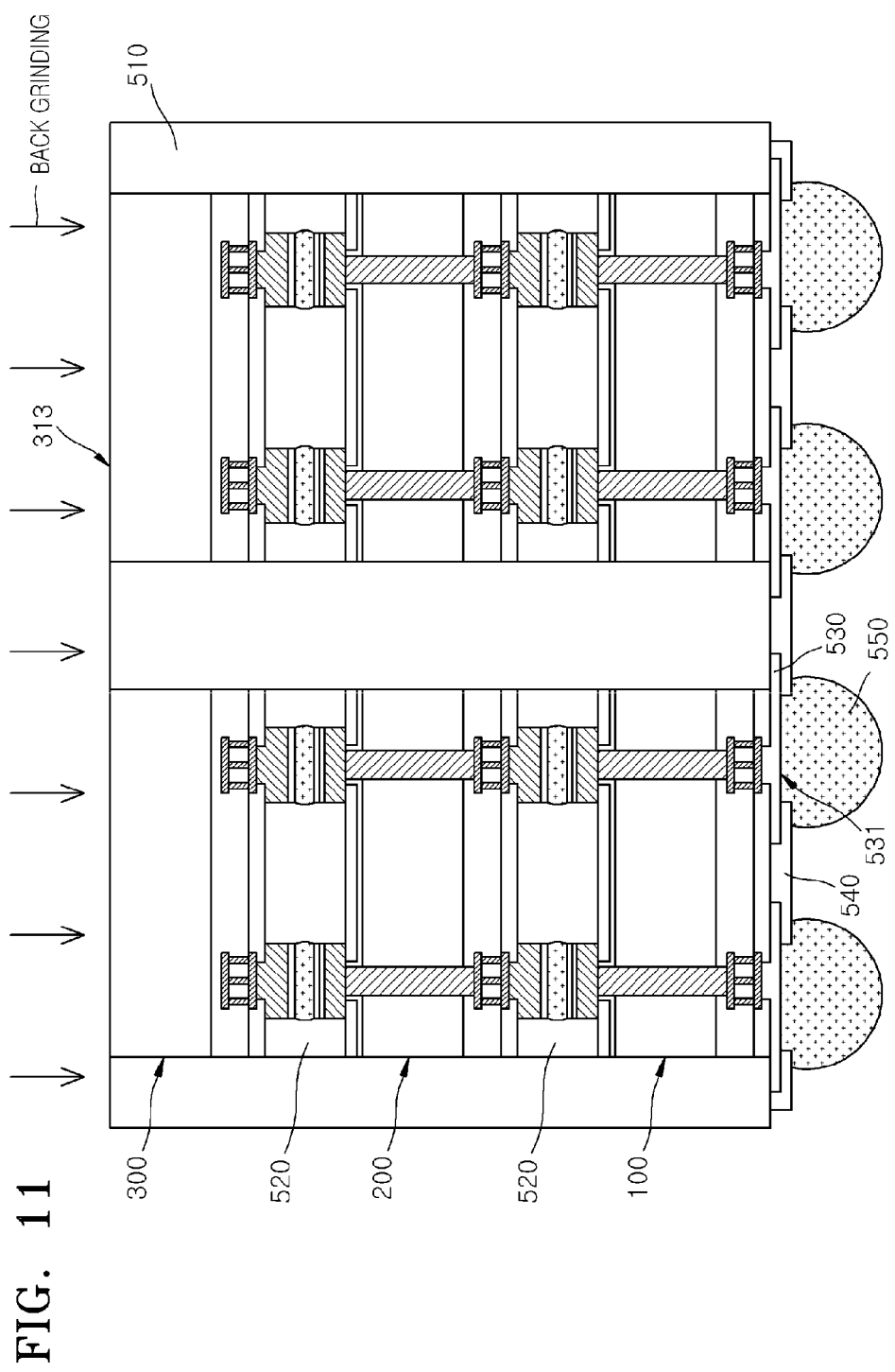

Referring to FIG. 11, a portion of the molding member 510 may be removed to expose a backside surface 313 of the upper semiconductor chip 300. The removing process may use a back grinding process. Further, outer connection terminals 550 including, for example, solder balls may be attached to the exposed package contact portions 531 using a ball mounting process.

Figure 12:
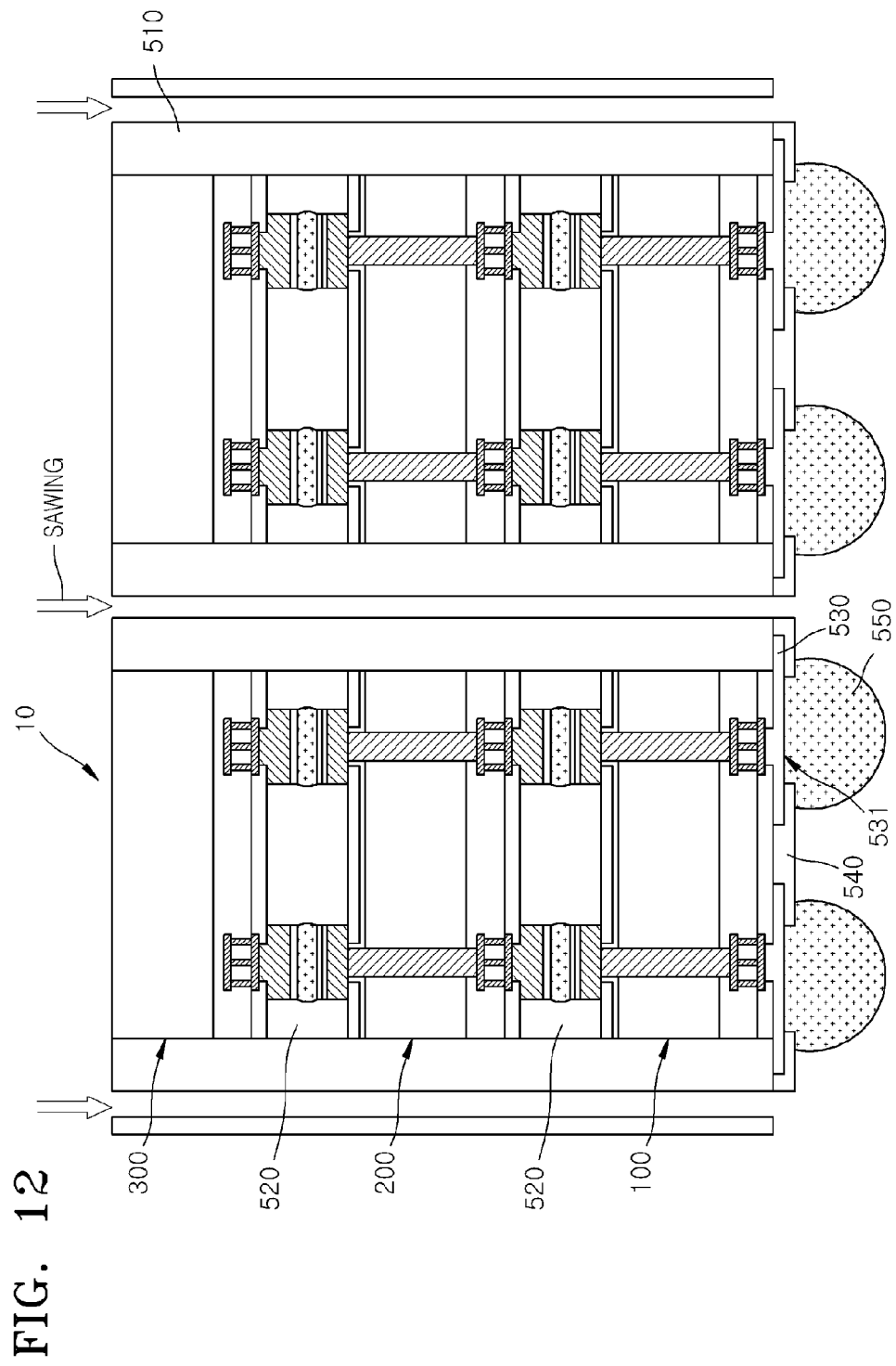

Referring to FIGS. 1 and 12, the molding member 510 between the stack structures may be cut using a sawing process to separate the stack structures from each other. As a result, a plurality of stack packages (10 in FIG. 1) may be formed.

According to the fabrication method described above, semiconductor chips 100, 200, and 300 may be stacked such that a plurality of stack structures including the semiconductor chips 100, 200 and 300 are two-dimensionally arrayed on a subsidiary substrate. Subsequently, a process for forming redistribution lines, a molding process, a back grinding process, a ball mounting process and a die sawing process may be sequentially applied to all the stack structures to form a plurality of separate stack packages. That is, the plurality of separate stack packages may be simultaneously formed as if a package process is applied to all semiconductor chips formed on a wafer to form a plurality of separate wafer-level packages.

In addition, a stack package according to the above embodiments may include a through via connection structure which is composed of through via electrodes to provide vertical signal paths. Thus, a compact package with a large capacity may be realized. Further, a backside passivation layer surrounding sidewalls of protrusion portions of the through via electrodes may be formed to serving as a diffusion barrier layer. Thus, even though the through via electrodes includes a copper material, the backside passivation layer may prevent the stack package from being contaminated by copper ions.

Figure 13:
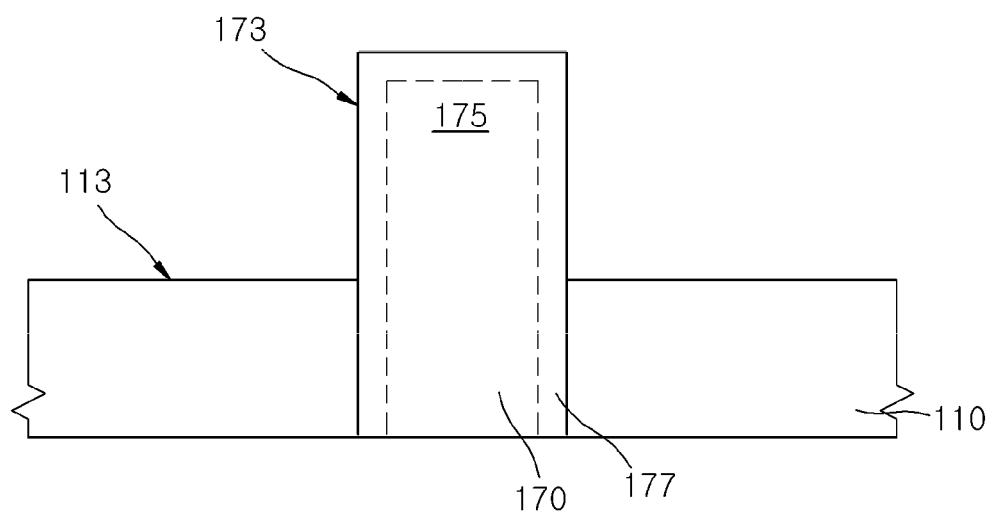
FIGS. 13 to 17 are cross-sectional views illustrating a method of forming an interconnection bump of a semiconductor chip constituting a stack package according to an embodiment.

Referring to FIG. 13, a through via electrode 170 and a barrier metal layer 177 surrounding the through via electrode 170 may penetrate a semiconductor substrate 110. The through via electrode 170 may include a protrusion portion 175 that protrudes from a backside surface 113 of the semiconductor substrate 110. The through via electrode 170 may include a copper material, and the protrusion portion 175 of the through via electrode 170 may be exposed by recessing a backside portion of the semiconductor substrate 110.

Figure 14:
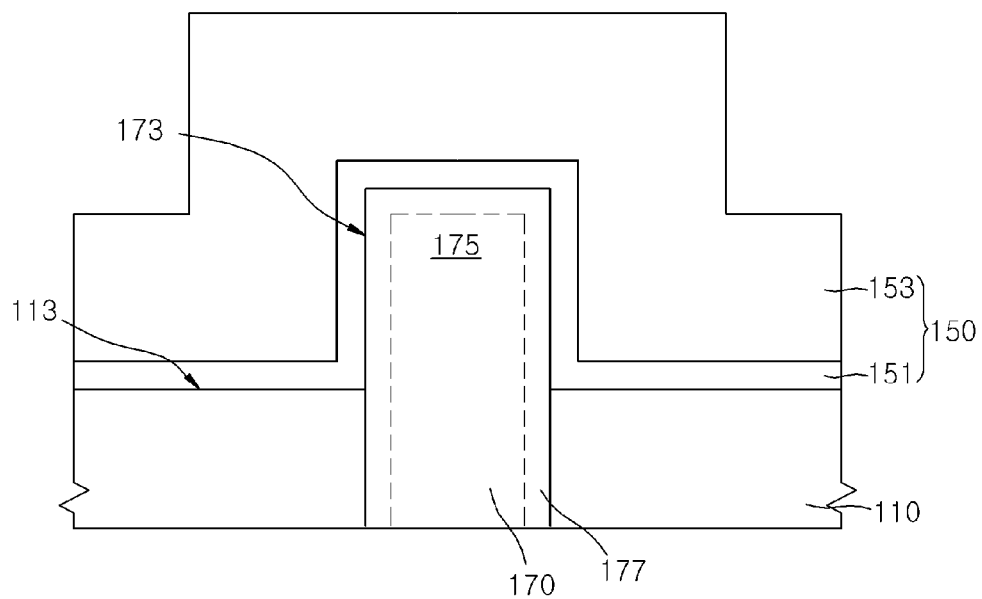

Referring to FIG. 14, a backside passivation layer 150 may be formed on the backside surface 113 of the semiconductor substrate 110 to cover the protrusion portion 175 of the through via electrode 170. Specifically, a first backside insulation layer 151 may be formed to cover a sidewall 173 and a top surface of the barrier metal layer 177 surrounding the protrusion portion 175. The first backside insulation layer 151 may be a conformal liner layer. The first backside insulation layer 151 may serve as a diffusion barrier layer that prevents metal ions in the through via electrode 170 from diffusing out. For example, the first backside insulation layer 151 may be formed of a silicon nitride layer or a silicon oxynitride layer which is conformally deposited on the backside surface 113 of the semiconductor substrate 110 and the protrusion portion 175 of the through via electrode 170.

A second backside insulation layer 153 may be formed on the first backside insulation layer 151 to compensate for an uneven surface of the first backside insulation layer 151. The second backside insulation layer 153 may be formed of a material different from the first backside insulation layer 151. The first backside insulation layer 151 and the second backside insulation layer 153 may collectively constitute the backside passivation layer 150. The second backside insulation layer 153 may alleviate a stress applied to the backside passivation layer 150, and thus enhance mechanical reliability of a bump structure disposed between the stacked semiconductor chips. That is, the second backside insulation layer 153 may serve as an insulation buffer layer. For example, the second backside insulation layer 153 may include a silicon oxide layer. Since the first backside insulation layer 151 is formed to entirely cover the protrusion portion 175 of the through via electrode 170, it may be more effective in suppressing diffusion of copper ions that the first backside insulation layer 151, compared with a case where the second backside insulation layer 153 is employed as a diffusion barrier layer. The second backside insulation layer 153 may buffer and alleviate a pressure applied to the backside passivation layer 150 while a chemical mechanical polishing (CMP) process is performed to planarize the backside passivation layer 150 in a subsequent process. Thus, the second backside insulation layer 153 may prevent the backside passivation layer 150 from being damaged or cracked during the planarization process.

Figure 15:
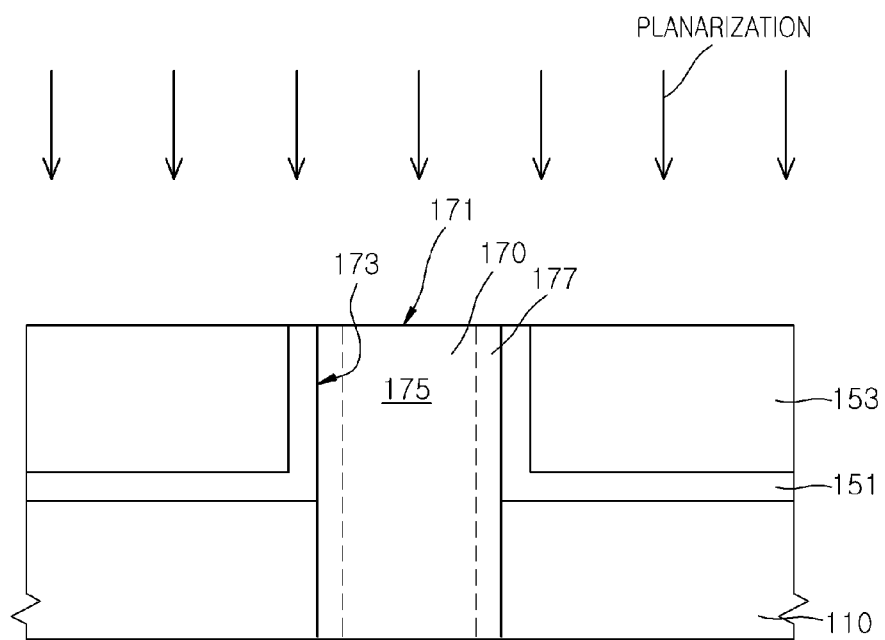

Referring to FIG. 15, the backside passivation layer 150 may be planarized to expose a top surface 171 of the protrusion portion 175 of the through via electrode 170. During the planarization process, a portion of the barrier metal layer 177 may be removed to expose the top surface 171 of the protrusion portion 175. After the planarization process, the backside passivation layer 150 may have a flat top surface and the exposed top surface 171 of the protrusion portion 175 may flush with the top surface of the backside passivation layer 150. Even after the planarization process, the first backside insulation layer 151 may contact the entire sidewall of the protrusion portion 175 to effectively function as a diffusion barrier layer. Moreover, the second backside insulation layer 153 may prevent the backside passivation layer 150 from being damaged or cracked during the planarization process, as described above.

As described with reference to FIGS. 13, 14, and 15, the backside passivation layer 150 may be formed to have a double-layered structure including a diffusion barrier layer and an insulation buffer layer. However, the embodiments are not limited thereto. For example, the backside passivation layer may be formed to have a multi-layered structure including at least three insulation layers.

Figure 16:
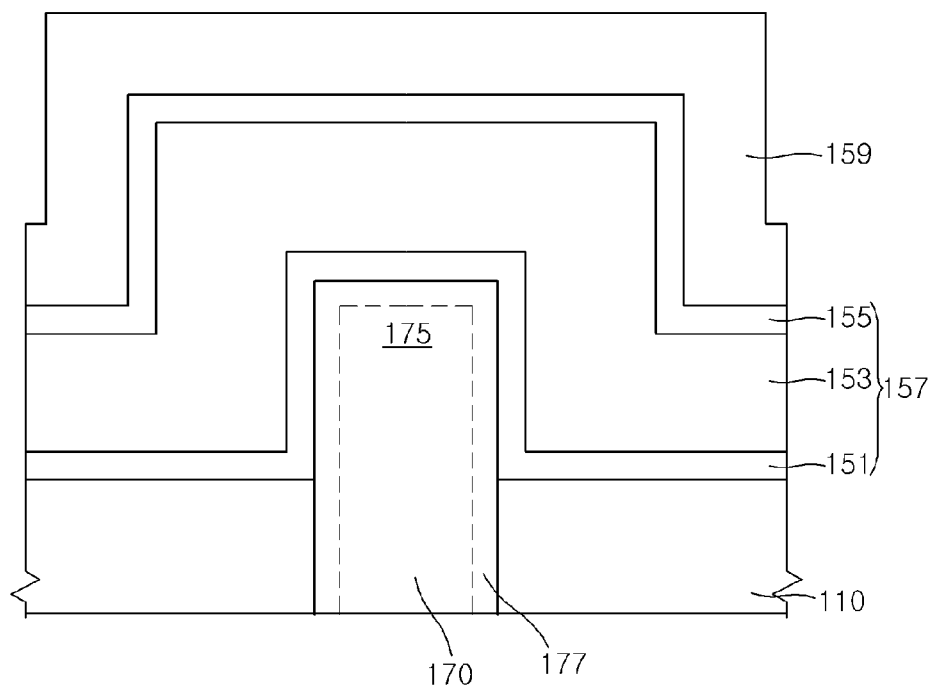

For example, referring to FIG. 16, a backside passivation layer 157 may be formed to have a triple-layered structure. Specifically, the through via electrode 170 and the barrier metal layer 177 surrounding the through via electrode 170 may be formed to penetrate the semiconductor substrate 110, as described above with reference to FIG. 13. The through via electrode 170 may be formed to include the protrusion portion 175 that protrudes from the backside surface 113 of the semiconductor substrate 110. The first backside insulation layer 151 may be formed to cover a sidewall 173 and a top surface of the barrier metal layer 177 surrounding the protrusion portion 175. The first backside insulation layer 151 may be formed of a conformal liner layer. The first backside insulation layer 151 may be formed of a diffusion barrier layer that prevents metal ions in the through via electrode 170 from diffusing out. For example, the first backside insulation layer 151 may be formed of a silicon nitride layer or a silicon oxynitride layer which is conformally deposited on the backside surface 113 of the semiconductor substrate 110 and the protrusion portion 175 of the through via electrode 170.

A second backside insulation layer 153 may be formed on the first backside insulation layer 151 to compensate for an uneven surface of the first backside insulation layer 151. The second backside insulation layer 153 may be formed of a material different from the first backside insulation layer 151. The second backside insulation layer 153 may alleviate a stress applied to the backside passivation layer 150 and enhance mechanical reliability of a bump structure disposed between the stacked semiconductor chips. That is, the second backside insulation layer 153 may be formed of an insulation buffer layer. For example, the second backside insulation layer 153 may be formed to include a silicon oxide layer. The second backside insulation layer 153 may prevent the backside passivation layer 157 from being damaged or cracked while the backside passivation layer 157 is planarized by a subsequent chemical mechanical polishing (CMP) process.

A third backside insulation layer 155 may be formed on the second backside insulation layer 153. The third backside insulation layer 155 may include a second diffusion barrier layer. The first, second and third backside insulation layers 151, 153 and 155 may comprise the backside passivation layer 157. The third backside insulation layer 155 serving as the second diffusion barrier layer may additionally prevent copper ions in the protrusion portion 175 of the through via electrode 170 from being diffused into the semiconductor substrate 110 through the backside surface 113 of the semiconductor substrate 110. The third backside insulation layer 155 may be formed of a conformal liner layer including a silicon nitride layer or a silicon oxynitride layer. In some embodiments, a fourth backside insulation layer 159 serving as a buffer layer may be additionally formed on the third backside insulation layer 155. The fourth backside insulation layer 159 may be formed to include a silicon oxide layer. The fourth backside insulation layer 159 may also prevent the backside passivation layer 157 from being damaged or cracked during a subsequent planarization process.

Figure 17:
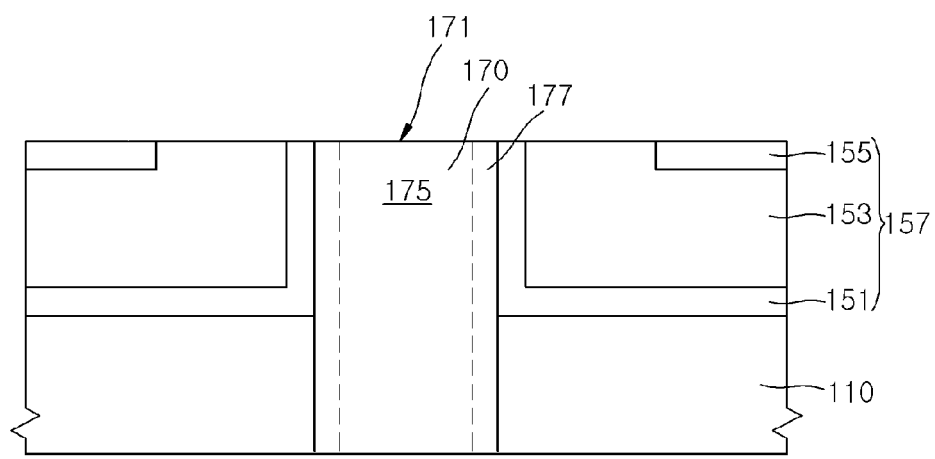

Referring to FIG. 17, the backside passivation layer 157 may be planarized using a CMP process to expose the top surface 171 of the protrusion portion 175. The third backside insulation layer 155 formed of a silicon nitride layer or a silicon oxynitride layer may serve as a polishing stop layer during the planarization process. The second and fourth backside insulation layers 153 and 159 may prevent the backside passivation layer 157 from being damaged or cracked during the planarization process.

Figure 18:
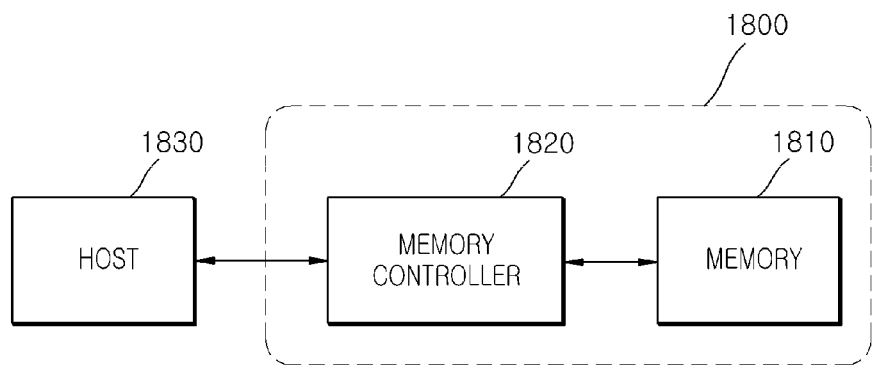
FIG. 18 is a block diagram illustrating an electronic system including a stack package according to an embodiment.

Referring to FIG. 18, the stack package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read out the stored data.

The memory 1810 may include nonvolatile memory device(s) to which the packaging technology of the embodiments is applied. The memory controller 1820 may control the memory 1810 such that stored data is read out or data is stored in response to a read/write request from a host 1830.

Figure 19:
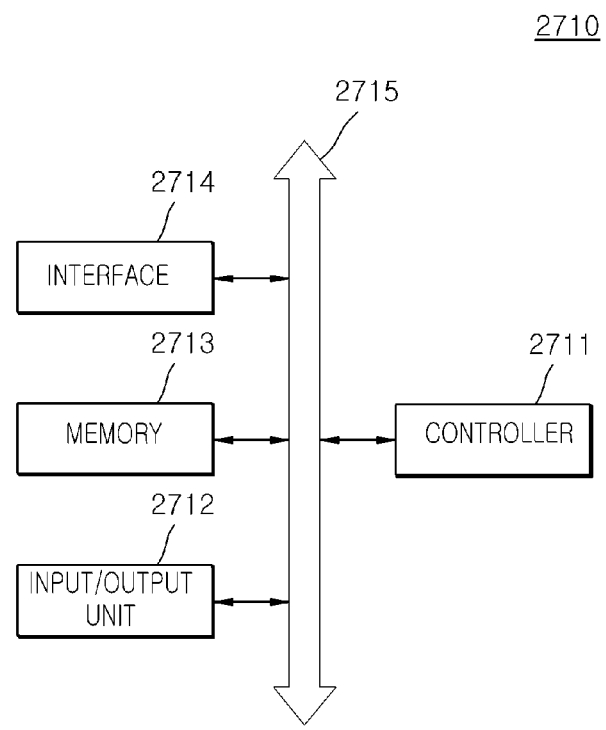
FIG. 19 is a block diagram illustrating another electronic system including a stack package according to an embodiment.

Referring to FIG. 19, the stack package in accordance with the embodiments may be applied to an electronic system 2710. The electronic system 2710 may include a controller 2711, an input/output unit 2712, and a memory 2713. The controller 2711, the input/output unit 2712 and the memory 2713 may be coupled with one another through a bus 2715 providing a path through which data move.

For example, the controller 2711 may include at least one microprocessor, at least one digital signal processor, at least one microcontroller, logic devices capable of performing the same functions as these components, or a combination thereof. The controller 2711 or the memory 2713 may include the stack packages according to the embodiments. The input/output unit 2712 may include a keypad, a keyboard, a display device, a touch screen and so forth. The memory 2713 is a device for storing data. The memory 2713 may store data and/or commands to be executed by the controller 2711, and the likes.

The memory 2713 may include a volatile memory device such as a DRAM and/or a nonvolatile memory device such as a flash memory. For example, a flash memory may be mounted to an information processing system such as a mobile terminal or a desk top computer. The flash memory may include a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In the case where the electronic system 2710 is an equipment capable of performing wireless communication, the electronic system 2710 may be used in a communication system such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

The embodiments have been disclosed above for illustrative purposes. Those skilled in the art will appreciate that various modifications, additions and substitutions are possible.

What is claimed is:

1. A stack package comprising:
an upper chip over a lower chip;
a lower through via electrode substantially penetrating the lower chip and including a protrusion portion that protrudes from a backside surface of the lower chip;
a backside passivation layer covering the backside surface of the lower chip and exposing the protrusion portion;
a backside bump substantially coupled to the protrusion portion;
a front side bump electrically coupled to a chip contact portion of the upper chip and further coupled to the backside bump; and
a molding member exposing a backside surface of the upper chip and provided over sidewalls of the lower chip and sidewalls of the upper chip,
wherein the backside passivation layer comprises:
a first insulation layer provided over a sidewall of the protrusion portion and the backside surface of the lower chip; and
a second insulation layer provided over the first insulation layer.

2. The stack package of claim 1, wherein the first insulation layer is a diffusion barrier.

3. The stack package of claim 1, wherein the backside passivation layer further includes a third insulation layer provided over a surface of the second insulation layer.

4. The stack package of claim 1, wherein the upper chip has a smaller size than the lower chip.

5. The stack package of claim 1, wherein the upper chip has a greater size than the lower chip.

6. The stack package of claim 1, further comprising:
an outer connection terminal disposed over a front side surface of the lower chip and extending over a bottom surface of the molding member; and
a redistribution line electrically coupling the outer connection terminal to the lower through via electrode and disposed over the front side surface of the lower chip.

7. The stack package of claim 1, further comprising an intermediate chip between the lower chip and the upper chip,
wherein the intermediate chip comprises:
an intermediate front side bump electrically coupled to the lower chip;
an intermediate through via electrode penetrating the intermediate chip and including a protrusion portion that protrudes from a backside surface of the intermediate chip;

an intermediate backside passivation layer provided over the backside surface of the intermediate chip and exposing the protrusion portion of the intermediate through via electrode; and an intermediate backside bump coupled to the protrusion portion of the intermediate through via electrode, and wherein the intermediate backside passivation layer comprises:

a first intermediate insulation layer provided over a sidewall of the protrusion portion of the intermediate through via electrode and the backside surface of the intermediate chip; and a second intermediate insulation layer provided over the first intermediate insulation layer.

8. The stack package of claim 2, wherein the second insulation layer is an insulation buffer layer.

9. The stack package of claim 3, wherein the third insulation layer is a diffusion barrier layer.

10. The stack package of claim 6, wherein the redistribution line extends over the bottom surface of the molding member.

11. A stack package comprising:

an upper chip disposed over a lower chip that a lower through via electrode penetrates;

a molding member provided over sidewalls of the lower chip and sidewalls of the upper chip;

an outer connection terminal disposed over a front side surface of the lower chip and over a bottom surface of the molding member; and a redistribution line electrically coupling the outer connection terminal to the lower through via electrode and disposed over the front side surface of the lower chip, wherein the redistribution line extends directly onto the bottom surface of the molding member.

12. The stack package of claim 11, further comprising:

a backside passivation layer provided over a backside surface of the lower chip and exposing a protrusion portion of the lower through via electrode, the protrusion portion protruding from the backside surface of the lower chip;

a backside bump substantially coupled to the protrusion portion; and a front side bump electrically coupled to a chip contact portion of the upper chip and further coupled to the backside bump, wherein the backside passivation layer comprises:

a first insulation layer provided over a sidewall of the protrusion portion and the backside surface of the lower chip; and a second insulation layer provided over the first insulation layer.

13. The stack package of claim 11, wherein the upper chip has a smaller size than the lower chip.

14. The stack package of claim 11, wherein the upper chip has a greater size than the lower chip.

15. The stack package of claim 11, wherein the molding member exposes a backside surface of the upper chip.

16. The stack package of claim 12, wherein the backside passivation layer further includes a third insulation layer provided over a surface of the second insulation layer.

17. The stack package of claim 12, wherein the backside passivation layer has a thickness substantially equal to a height of the protrusion portion.

* * * * *